United States Patent
Refai-Ahmed et al.

(10) Patent No.: US 8,472,190 B2
(45) Date of Patent: Jun. 25, 2013

(54) STACKED SEMICONDUCTOR CHIP DEVICE WITH THERMAL MANAGEMENT

(75) Inventors: Gamal Refai-Ahmed, Markham (CA); Bryan Black, Spicewood, TX (US); Michael Z. Su, Round Rock, TX (US)

(73) Assignees: ATI Technologies ULC, Markham (CA); Advanced Micro Devices, Inc., Sunnyvale ( * ) Notice: Subject to any disclaimer, the term of this patent is extended or adjusted under 35 U.S.C. 154(b) by 260 days.

(21) Appl. No.: 12/889,590

(22) Filed: Sep. 24, 2010

(65) Prior Publication Data

US 2012/0075807 A1    Mar. 29, 2012

(51) Int. Cl.
*H05H 7/20*    (2006.01)

(52) U.S. Cl.
USPC ........... 361/704; 361/760; 361/707; 361/709; 361/717; 361/719

(58) Field of Classification Search
USPC .......... 361/704, 707, 709, 717–719; 257/737, 257/739
See application file for complete search history.

(56) References Cited

U.S. PATENT DOCUMENTS

| | | | | |
|---|---|---|---|---|
| 5,856,911 | A | * | 1/1999 | Riley ............................ 361/704 |
| 6,501,164 | B1 | | 12/2002 | Chen et al. |
| 6,580,611 | B1 | * | 6/2003 | Vandentop et al. ........... 361/704 |
| 6,853,070 | B2 | * | 2/2005 | Khan et al. ..................... 257/707 |
| 6,861,750 | B2 | * | 3/2005 | Zhao et al. ..................... 257/739 |
| 7,198,980 | B2 | | 4/2007 | Jiang et al. |
| 8,076,182 | B2 | * | 12/2011 | Lin et al. ....................... 438/118 |
| 2004/0217485 | A1 | | 11/2004 | Chung |
| 2005/0167798 | A1 | | 8/2005 | Doan |

OTHER PUBLICATIONS

PCT/US2011/052466 International Search Report mailed Jan. 6, 2012.

* cited by examiner

*Primary Examiner* — Nguyen T Ha
(74) *Attorney, Agent, or Firm* — Timothy M. Honeycutt

(57) ABSTRACT

A method of manufacturing is provided that includes placing a thermal management device in thermal contact with a first semiconductor chip of a semiconductor chip device. The semiconductor chip device includes a first substrate coupled to the first semiconductor chip. The first substrate has a first aperture. At least one of the first semiconductor chip and the thermal management device is at least partially positioned in the first aperture.

24 Claims, 5 Drawing Sheets

400
STACKED SEMICONDUCTOR CHIP DEVICE WITH THERMAL MANAGEMENT

BACKGROUND OF THE INVENTION

1. Field of the Invention

This invention relates generally to semiconductor processing, and more particularly to thermal management structures for stacked semiconductor chips and to methods of assembling the same.

2. Description of the Related Art

Stacked semiconductor chip devices present a host of design and integration challenges for scientists and engineers. Common problems include providing adequate electrical interfaces between the stacked semiconductor chips themselves and between the individual chips and some type of circuit board, such as a motherboard or semiconductor chip package substrate, to which the semiconductor chips are mounted. Another critical design issue associated with stacked semiconductor chips is thermal management. Most electrical devices dissipate heat as a result of resistive losses, and semiconductor chips and the circuit boards that carry them are no exception. Still another technical challenge associated with stacked semiconductor chips is testing.

A process flow to transform a bare semiconductor wafer into a collection of chips and then mount those chips on packages or other boards involves a large number of individual steps. Because the processing and mounting of a semiconductor chip proceeds in a generally linear fashion, that is, various steps are usually performed in a specific order, it is desirable to be able to identify defective parts as early in a flow as possible. In this way, defective parts may be identified so that they do not undergo needless additional processing. This economic incentive to identify defective parts as early in the processing phase as possible is certainly present in the design and manufacture of stacked semiconductor chip devices. This follows from the fact that a typical process flow for fabricating a stacked semiconductor chip device includes the multitude of fabrication steps that go into successively mounting a plurality of singulated semiconductor chips to a circuit board. If, for example, the first semiconductor chip mounted to a carrier substrate is revealed to be defective only after several other semiconductor chips are stacked thereon, then all of the material processing steps and the materials associated with the later-mounted chips may have been wasted.

Thermal management of a semiconductor chip or chips in a stacked arrangement remains a technical challenge during required electrical testing of one or more of the semiconductor chips. A given semiconductor chip in a stacked arrangement, whether the first, an intermediary or the last in the particular stack, may dissipate heat to such an extent that active thermal management is necessary in order to either prevent the one or all of the semiconductor chips in the stack from entering thermal runaway or so that one or more of the semiconductor chips in the stack may be electrically tested at near or true operational power levels and frequencies.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes coupling a first semiconductor chip to a first substrate. The first substrate includes a first aperture. A thermal management device is placed in thermal contact with the first semiconductor chip by way of the first aperture.

In accordance with another aspect of an embodiment of the present invention, a method manufacturing is provided that includes placing a thermal management device in thermal contact with a first semiconductor chip of a semiconductor chip device. The semiconductor chip device includes a first substrate coupled to the first semiconductor chip. The first substrate has a first aperture. The thermal contact is by way of the first aperture.

In accordance with another aspect of an embodiment of the present invention, an apparatus is provided that includes a semiconductor chip device that has a first semiconductor chip coupled to a first substrate. The first substrate includes a first aperture. A thermal management device is in thermal contact with the first semiconductor chip by way of the first aperture.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various stacked semiconductor chip arrangements are disclosed. The disclosed embodiments incorporate a substrate or circuit board with an aperture to accommodate at least a portion of one of the semiconductor chips and/or a thermal management device. The thermal management device is operable to dissipate heat from a lowermost semiconductor chip in the chip stack. The aperture reduces the form factor of the stack while still providing thermal management. Additional details will now be described.

Figure 1:
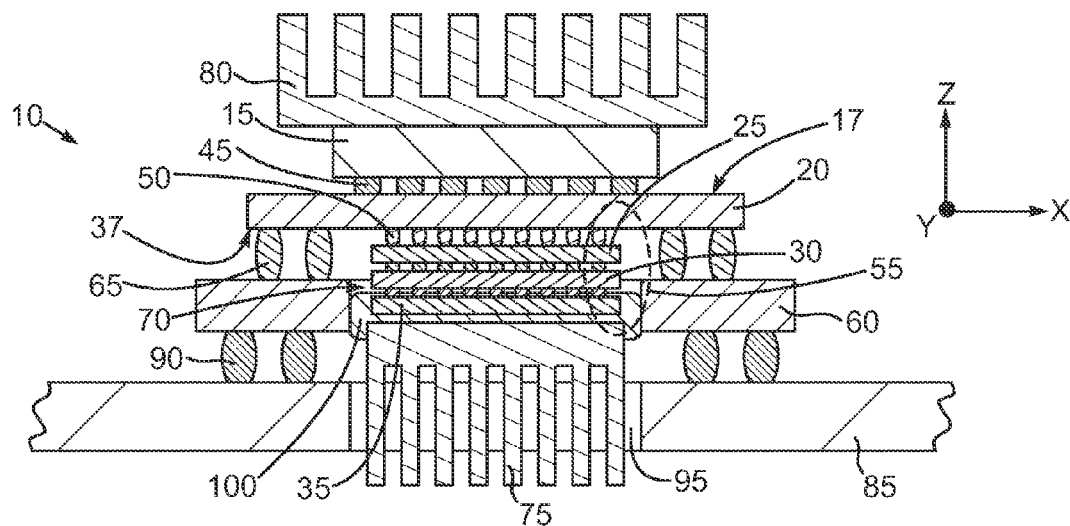
FIG. 1 is a sectional view of an exemplary embodiment of semiconductor chip device that includes semiconductor chips connected to opposite sides of an interposer.

In the drawings described below, reference numerals are generally repeated where identical elements appear in more than one figure. Turning now to the drawings, and in particular to FIG. 1, therein is shown a sectional view of an exemplary embodiment of semiconductor chip device 10 that includes a semiconductor chip 15 connected to a side 17 of an interposer 20 and plural semiconductor chips 25, 30 and 35 connected to the opposite side 37 of the interposer 20. The exemplary structures of the semiconductor chip device 10 and alternatives thereof disclosed herein are and associated with the semiconductor chips 15, 25, 30 and 35 disclosed herein are not dependent on a particular electronic functionality or particular types of semiconductor chips or interposers. Thus, the semiconductor chips 15, 25, 30 and 35 may be any of a myriad of different types of circuit devices used in electronics, such as, for example, microprocessors, graphics processors, combined microprocessor/graphics processors, application specific integrated circuits, memory devices, active optical devices, such as lasers, passive optical devices or the like, and may be single or multi-core or even stacked laterally with additional dice. Furthermore, any or all of the semiconductor chips 15, 25, 30 and 35 could be configured as an interposer with or without some logic circuits, and the interposer 20 could be a semiconductor chip. Thus the term "chip" includes an interposer and vice versa. The semiconductor chips 15, 25, 30 and 35 and the interposer 20 may be constructed of bulk semiconductor, such as silicon or germanium, or semiconductor on insulator materials, such as silicon-on-insulator materials, or other chip or even insulating materials. If constructed as a dedicated interposer, the interposer 20 may be composed of a variety of materials suitable for use in a stacked semiconductor chip arrangement. Some desirable properties include, for example, a coefficient of thermal expansion that is relatively close to the CTE's of the semiconductor chips 15, 25, 30 and 35, ease of manufacture, and thermal conductivity. Exemplary materials include, for example, silicon, germanium, sapphire, diamond, carbon nanotubes in a polymer matrix, or the like.

The semiconductor chip 15 may be electrically connected to the interposer 20 by way of plural interconnect structures 45. The interconnect structures 45 may be conductive pillars, solder joints or other types of interconnects. The semiconductor chip 25 may be similarly connected to the interposer 20 by way of plural interconnect structures 50 which may be conductive pillars, solder joints or other types of interconnects.

The dashed oval 55 circumscribes portions of the interposer 20, the semiconductor chips 25, 30 and 35 and other structures. That portion circumscribed by the dashed oval 55 will be shown at greater magnification in FIG. 2. Before turning to FIG. 2, however, additional details of FIG. 1 will be presently described. The interposer 20 may be mounted to a substrate or circuit board 60 and electrically connected thereto by way of plural interconnect structures 65. The interconnect structure 65 may be conductive pillars, solder joints or other types of interconnects. The exemplary structures of the semiconductor chip device 10 disclosed herein are not dependent on a particular electronic circuit board functionality. Thus, the circuit board 60 may be a semiconductor chip package substrate, a motherboard, a circuit card, or virtually any other type of printed circuit board. Although a monolithic structure could be used for the circuit board 60, a more typical configuration will utilize a buildup design. In this regard, the circuit board 60 may consist of a central core upon which one or more buildup layers are formed and below which an additional one or more buildup layers are formed. The core itself may consist of a stack of one or more layers. If implemented as a semiconductor chip package substrate, the number of layers in the circuit board 60 can vary from four to sixteen or more, although less than four may be used. So-called "coreless" designs may be used as well. The layers of the circuit board 60 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards. The circuit board 60 is provided with a number of conductor traces and vias and other structures (not visible) in order to provide power, ground and signals transfers between the semiconductor chips 15, 25, 30 and 35 and the interposer 20 and another device, such as another circuit board for example.

While it is desirable to be able to mount one or more semiconductor chips, such as the semiconductor chips 25, 30 and 35 to the side 37 of the interposer 20, such structures necessarily increase the overall height of the semiconductor chip device 10. This height increase may present design complications in situations where there is limited space available for the semiconductor chip device 10 in some other electronic device. To compensate for the potential height increase associated with having semiconductor chips connected to both sides 35 and 40 of the interposer 20, the circuit board 60 may be provided with an aperture 70 in which one or more of the semiconductor chips 25, 30 and 35 may project. The aperture 70 advantageously projects entirely through the thickness of the circuit board 60 to enable an optional thermal management device 75 to be placed in thermal contact with at least the semiconductor chip 30. The positions of the semiconductor chips 25, 30 and 35 and the thermal management device 75 relative to the aperture 70 may be varied to provide some desirable height for the semiconductor chip device 10. For example, at least one of the semiconductor chips 25, 30 and 35 could be partially or completely positioned in the aperture 70 and/or a portion of the thermal management device 75 could be similarly positioned. In any event, the thermal management device 75 is in thermal contact with the semiconductor chip 35 by way of the aperture 70.

The thermal management device 75 may take on a myriad of configurations such as the heat-finned heat spreader arrangement as shown or virtually any other type of heat transfer device design. If desired, the thermal management device 75 may include a vapor chamber and/or a solid state thermoelectric cooler. Various types of materials suitable for heat transfer devices may be used, such as copper, nickel, aluminum, steel, combinations of these or the like. Somewhat more exotic materials, such as diamond or sapphire, could also be used for extreme thermal environments.

An optional heat spreader 80 may be mounted on the semiconductor chip 15 to provide thermal management for the upper reaches of the semiconductor chip device 10. The heat spreader 80 may take on a myriad of configurations, such as the finned design as shown, a more traditional semiconductor chip package lid, combinations of the two or virtually any other type of heat conveyance device. Again, exemplary materials include copper, nickel, aluminum, steel, combinations of these or the like. Somewhat more exotic materials, such as diamond or sapphire, could also be used for extreme thermal environments.

The semiconductor chip device 10 may be mounted to a variety of different types of electronic structures. In this illustrative embodiment, the semiconductor chip device 10 is mounted to a circuit board 85, which may be a circuit card, a motherboard or virtually any type of circuit board, and connected thereto by way of plural interconnect structures 90, which bond the circuit board 60 to the circuit board 85. The interconnect structures 90 in this illustrative embodiment may be an array of solder balls. However, the skilled artisan will appreciate that other types of interconnect structures, such as pin grid arrays, land grid arrays or other interconnect structures could be used as well. In this illustrative embodiment, the thermal management device 75 that is in thermal contact with at least the semiconductor chips 35 may have a thickness large enough to require projection either into or through the circuit board 85. To accommodate the thermal management device 75 in this circuit board 85 may be provided with a suitable aperture 95 to accommodate the thermal management device 75. If the thermal management device 75 has sufficient dimension along the z-axis then convective cooling may be accomplished if there is air or other gaseous flow in the x-y plane.

To facilitate the thermal contact between the thermal management device 75 and at least the semiconductor chip 35, a thermal interface material 100 may be positioned in the aperture 70 and in thermal contact with the thermal management device 75 and at least the semiconductor chip 35. If desired, the thermal interface material 100 may be extensive enough to completely fill the aperture 70 as desired. The thermal interface material 100 may be composed of a variety of different types of thermal interface material suitable for thermal management, such as, silicone rubber, silicone greases, acrylic polymers or the like. Even metallic materials, such indium, gallium, various solders or the like could be used. Of course, the semiconductor chip 35 may have to fabricated with a suitable wetting film or even a stack if a metallic material is used. Such a stack might include an aluminum film formed on the semiconductor chip 35, a titanium film formed on the aluminum film, a nickel-vanadium film formed on the titanium film and a gold film formed on the nickel-vanadium film. The aluminum film provides advantageous adhesion with silicon. The titanium film provides a barrier layer to prevent gold and indium from migrating into the semiconductor chip 35 and to facilitate adhesion with the nickel-vanadium film, and the nickel-vanadium film provides desirable adhesion with gold and a barrier to inhibit diffusion into the titanium layer. The gold film provides a desirable wetting surface for indium.

Figure 2:
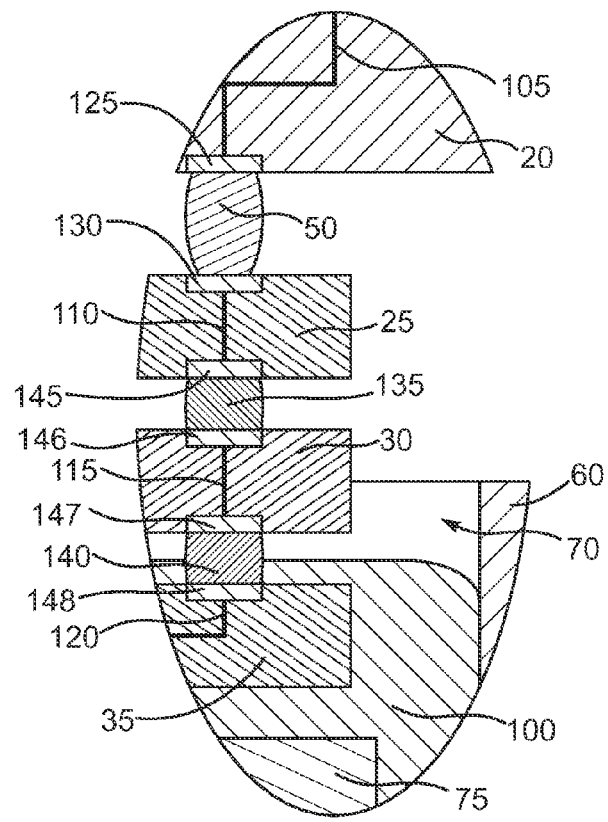
FIG. 2 is a portion of FIG. 1 shown at greater magnification.

Attention is now turned to FIG. 2, which as noted above is the portion of FIG. 1 circumscribed by the dashed oval 55 shown at greater magnification. Here, small portions of the interposer 20, the semiconductor chips 25, 30 and 35, the circuit board 60 and the thermal interface material 100 are visible. Furthermore, a small portion of the thermal management device 75 is also visible. The interposer 20 may be provided with numerous internal wiring structures, such as the wiring structure represented schematically by the black line 105. The semiconductor chips 25, 30 and 35 may be similarly provided with multiple internal wiring structures which are represented schematically by the black lines 110, 115 and 120 respectively. The skilled artisan will appreciate that the wiring structures 105, 110, 115 and 120 may be single wiring lines or multiple conductor layers interconnected by conductive vias or other types of structures as desired. The interposer 20 may be electrically connected to the semiconductor chip 25 as described above by way of plural interconnect structures 50. The interconnect structures 50 may be microbumps, conductive pillars or the like. The interconnect structures 50 may be electrically connected to respective conductor structures or pads 125 and 130 of the interposer 20 and the semiconductor chip 25. The semiconductor chips 25 and 30 may be connected electrically by conductor structures 135 and the semiconductor chips 30 and 35 may be connected electrically by conductor structures 140. The conductor structures 135 and 140 may be microbumps, conductive pillars or the like. The conductor structures 135 may be electrically connected to respective conductor structures or pads 145 and 146 of the semiconductor chips 25 and 30 and the conductor structures may be electrically connected to respective conductor structures or pads 147 and 148 of the semiconductor chips 30 and 35.

Any of the conductor structures disclosed herein as possibly being composed of solder may be composed of various types of solders, such as lead-free or lead-based solders. Examples of suitable lead-free solders include tin-silver (about 97.3% Sn 2.7% Ag), tin-copper (about 99% Sn 1% Cu), tin-silver-copper (about 96.5% Sn 3% Ag 0.5% Cu) or the like. Examples of lead-based solders include tin-lead solders at or near eutectic proportions or the like.

The various pads 125, 130, 145, 146, 147 and 148, or conductive pillars referenced above, may be composed of copper, aluminum, silver, gold, platinum, titanium, refractory metals, refractory metal compounds, alloys of these or the like. If desired, the pads 125, 130, 145, 146, 147 and 148 may consist of underbump metallization structures, which provide a barrier functionality to inhibit solder infusion. For example, a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used for the conductors. Various well-known techniques for applying metallic materials may be used, such as plating, physical vapor deposition, chemical vapor deposition, or the like.

As noted above, the thermal interface material 100 may be partially coextensive with the aperture 170 as depicted in FIG. 2 or even completely coextensive. Indeed, the thermal interface material 100 could be provided in such quantity that all of the semiconductor chips 25, 30 and 35 are in contact therewith.

Figure 3:
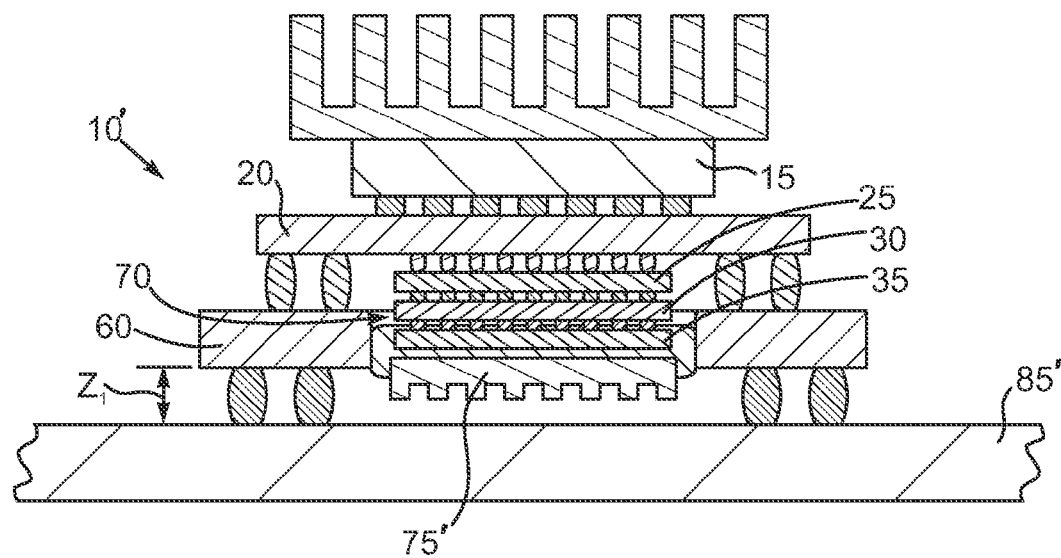
FIG. 3 is a sectional view like FIG. 1, but of an alternate exemplary embodiment of a semiconductor chip device that includes semiconductor chips connected to opposite sides of an interposer and with an alternative thermal management device.
Figure 4:
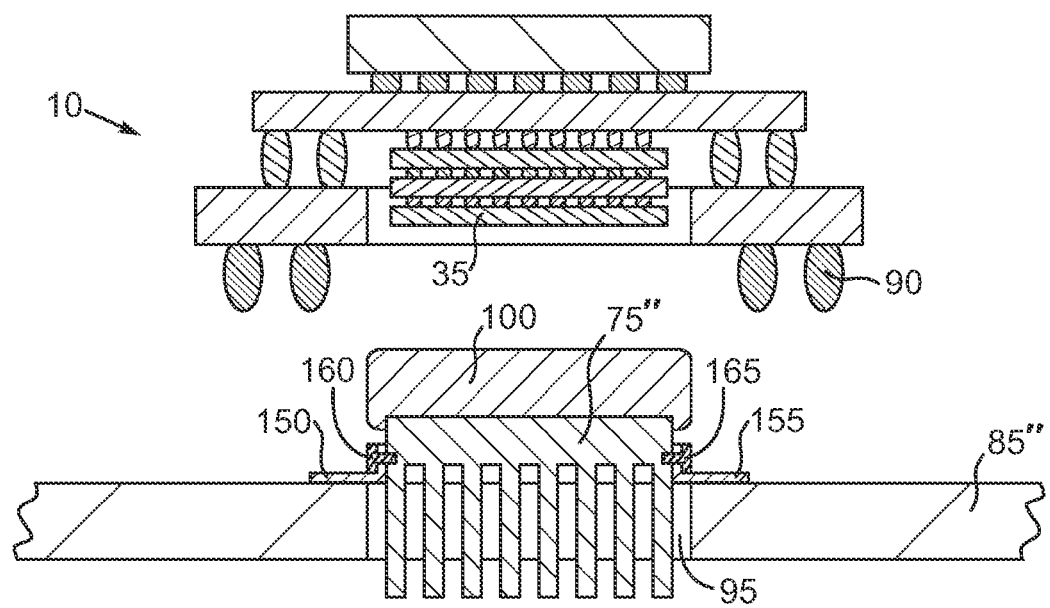
FIG. 4 is a sectional view of an exemplary semiconductor chip device exploded from a circuit board with a thermal management device mounted thereto.

An alternate exemplary embodiment of the semiconductor chip device 10' may be understood by referring now to FIG. 3, which is a sectional view like FIG. 1. Here, the semiconductor chip device 10' may be configured substantially like the semiconductor chip device 10 with a few notable exceptions. Thus, semiconductor chips 15, 25, 30 and 35 may be connected to opposite sides of the interposer 20. A heat sink spreader 75' may be placed in thermal contact with at least the semiconductor chip 35 and the chips 25, 30 and 35 may be positioned partially or entirely in an aperture 70 in the circuit board 60. However, the thermal management device 75' in this illustrative embodiment has a shorter height than the thermal management device 75 depicted in FIG. 1. Thus, there is no need to provide the circuit board 85' with an aperture to accommodate the thermal management device 75'. All that is required is for a sufficient gap $Z_1$ to be provided to accommodate the alternate thermal management device 75'.

In the foregoing illustrative embodiments, the thermal management device 75 or 75' is secured to the semiconductor chip device 10 largely by the inherent tackiness of the thermal interface material 100. However, the skilled artisan will appreciate that a variety of mechanisms may be used to position a thermal management device relative to the semiconductor chips of any of the disclosed embodiments of a semiconductor chip device. In this regard, attention is now turned to FIG. 2, which is a sectional view depicting the semiconductor chip device 10 exploded from an alternate exemplary embodiment of a circuit board 85". Here, a thermal management device 75" may be secured to the circuit board 85" and project downwardly through an aperture 95 therein by way of one or more brackets 150 and 155. The brackets 150 and 155 may be secured to the circuit board 85" by any of a myriad of known fastening techniques, such as screws, solder, adhesives, etc. The thermal management device 75" may be secured to the brackets 150 and 155 by way of the depicted screws 160 and 165 or by adhesives, clips, even solder or any of a variety of well-known fastening techniques. Thus, the thermal management device 75" may be secured to the circuit board 85" first and thereafter the semiconductor chip device 10 may be mounted to the circuit board 85" so that thermal contact is established between the thermal interface material 100 and at least the semiconductor chip 35 of the semiconductor chip device 10. Thereafter, a suitable reflow process may be performed as necessary in order to establish metallurgical bonding associated with the interconnect structures 90 and the circuit board 85".

Figure 5:
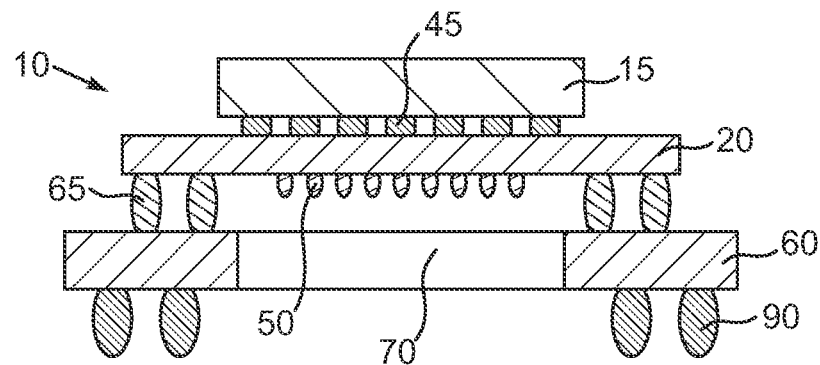
FIG. 5 is a sectional view of an exemplary semiconductor chip device at a preliminary stage of assembly.
Figure 6:
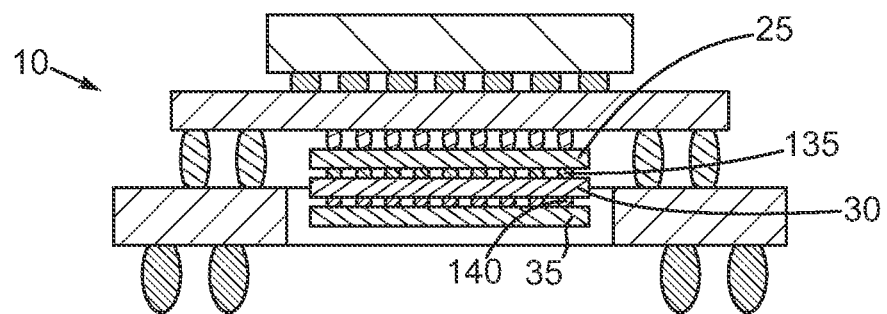
FIG. 6 is a sectional view like FIG. 5, but depicting additional assembly.
Figure 7:
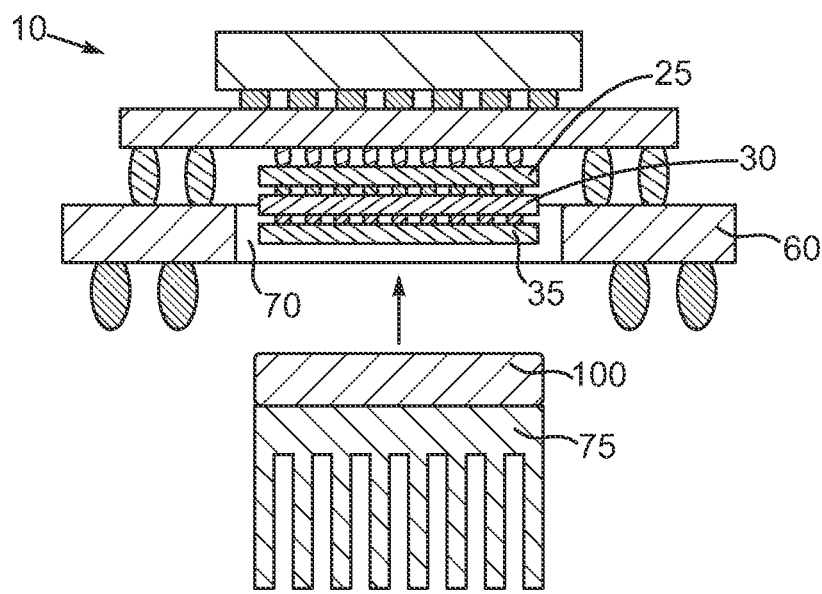
FIG. 7 is a sectional view like FIG. 6 depicting attachment of an exemplary thermal management device to the semiconductor chip device.

An exemplary process flow for assembling the semiconductor chip device 10 depicted in FIGS. 1 and 2 may be understood by referring now to FIGS. 5, 6 and 7 and initially to FIG. 5. FIG. 5 is a sectional view of the semiconductor chip device 10 prior to the mounting thereto of the semiconductor chips 25, 30 and 35 depicted in FIGS. 1 and 2. Here, the semiconductor chip 15, if produced en masse as part of a semiconductor wafer or other work piece may be first singulated and thereafter mounted to the interposer 20 and electrically connected thereto by the interconnect structures 45. The interposer 20 may similarly be fabricated en masse and singulated prior to or after the mounting thereto of the semiconductor chip 15. In any event, the interconnect structures 45 may be subjected to a solder reflow process as necessary depending upon their composition. Furthermore, the interconnect structures 65 may be fabricated and connected to the interposer 20 prior to mounting the interposer 20 to the circuit board 60 or in the event that the interconnect structure 65 constitute the union between two structures such as two solder bumps or a pillar and a bump, etc. then the interconnect structure 65 may be separately formed in their respective haves on the interposer 20 and the circuit board 60 and thereafter joined together in a mounting/reflow process. In any event, the interconnect structures 50 that are designed to electrically interface and bond with the semiconductor chip 25 depicted in FIGS. 1 and 2 may be positioned on the interposer 20 at this point or at a later stage if desired.

The aperture 70 may be established in the circuit board 60 in a variety of ways. In one illustrative embodiment, the circuit board 60 may be fully formed and thereafter a suitable material removal process may be performed in order to establish the aperture. This may constitute, for example, a suitable etch process, laser ablation or some other material removal process. Optionally, the circuit board 60 may be formed in successive build up processes in which the aperture 70 is simply patterned and thus formed as part of the build up process. Furthermore, the interconnect structures 90 may be attached to the circuit board 60 at this stage or, such structures may actually be positioned on, for example, the circuit board 85 and thereafter connected to the circuit board 60. Again, the actual process for establishing the interconnect structures 90 will depend upon their composition such is the case if the interconnect structures 90 consist of a solder joint formed by the mating of two solder structures such as bumps.

At this stage, the semiconductor chip 15 and the interposer 20 are both in electrical contact with the circuit board 60. Thus, the entire semiconductor chip device consisting of the chip 15, the interposer 20 and the circuit board 60 may be subjected to electrical testing to verify the integrity of those three major components. This is advantageous since failure in any of those major components may be detected at this stage without having to go through the time and expense and possible material costs associated with performing such testing only after the semiconductor chips 25, 30 and 35 depicted in FIGS. 1 and 2 are mounted thereto.

As shown in FIG. 6, the semiconductor chips 25, 30 and 35 may be mounted to the interposer 20 by establishing the respective interconnect structures (135 and 140 shown in FIG. 2). This may entail, for example, a suitable reflow process or processes. With the semiconductor chips 25, 30 and 35 in position, the semiconductor chip device 10 may again undergo electrical testing to verify not only the functionality of the semiconductor chips 25, 30 and 35, but also the various combined electrical functionality of the entire semiconductor chip device 10.

Next, and as shown in FIG. 7, the thermal management device 75 may be supplied with a quantity of the thermal interface material 100 and thereafter brought into contact with at least the semiconductor chip 35 of the semiconductor chip device 10. Note that the aperture 70 enables the semiconductor chips 25, 30 and 35 to be readily moved into engagement with the interposer 20 after the interposer 20 has been mounted to the circuit board 60. Optionally, a portion or all of the thermal interface material 100 may be applied to the semiconductor chip 35 and the other semiconductor chips 30 and 25 as desired and thereafter the thermal management device 75 may be brought into contact therewith in order to establish the requisite thermal contact.

Figure 8:
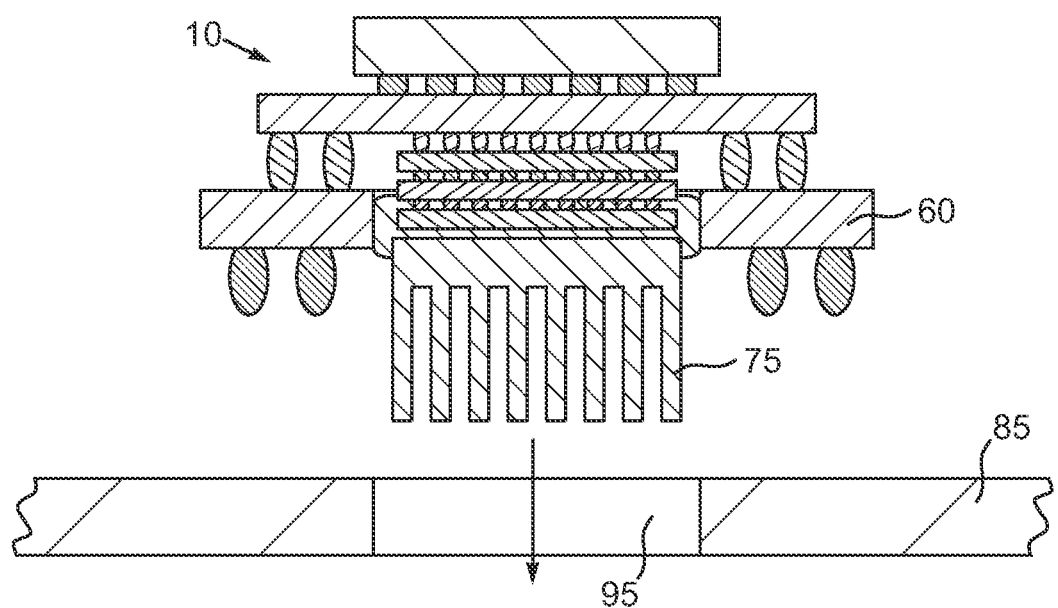
FIG. 8 is a sectional view depicting mounting of the exemplary semiconductor chip device on a exemplary circuit board.

Next, and as depicted in FIG. 8, the semiconductor chip device 10 including the thermal management device 75 may be positioned on the circuit board 85 so that the thermal management device 75 projects at least partially and possibly all the way through the aperture 95 and a reflow if necessary performed in order to bond the circuit board 85 by way of the interconnect structures 90.

In the foregoing illustrative embodiments, one or more semiconductor chips may be stacked on an underside of an interposer and project downwardly in or through a single aperture in a circuit board. However, the skilled artisan will appreciate that other arrangements are possible. In this regard, attention is now turned to FIG. 9, which is a sectional view like FIG. 1 but of an alternate exemplary embodiment of a semiconductor chip device 10" which shares many of the characteristics of the other illustrative embodiments, such as a semiconductor chip 15 mounted on an interposer 20. Here, however, plural stacks 170 and 175 of semiconductor chips may be mounted to the interposer 20 and project downwardly through or completely through respective apertures 180 and 185 in a circuit board 190 which may be configured like the circuit board 60 depicted in FIGS. 1 and 2 with the provision that multiple apertures 180 and 185 are provided therein. To provide thermal management, the thermal management device 75 may be in thermal contact with respective thermal interface material portions 200 and 205 that are positioned in the apertures 180 and 185. Optionally, multiple thermal management devices 75, one for each of the stacks 170 and 175 could be placed in thermal contact therewith as desired. Again, the circuit board 85 may be provided with the aperture 95 to accommodate the thermal management device 75. Certainly, the thermal management device 75' depicted in FIG. 3 could be used in this illustrative embodiment as well. The skilled artisan will appreciate that the number and spatial orientation of the apertures 180 and 185 is subject to design discretion.

Figure 9:
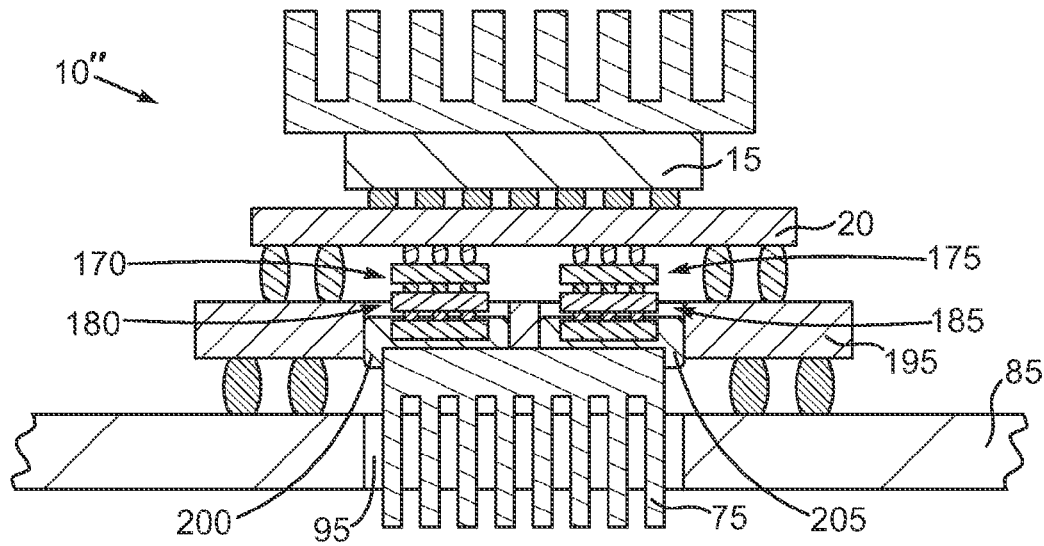
FIG. 9 is a sectional view of an alternate exemplary embodiment of a semiconductor chip device that includes semiconductor chips connected to opposite sides of an interposer.
Figure 10:
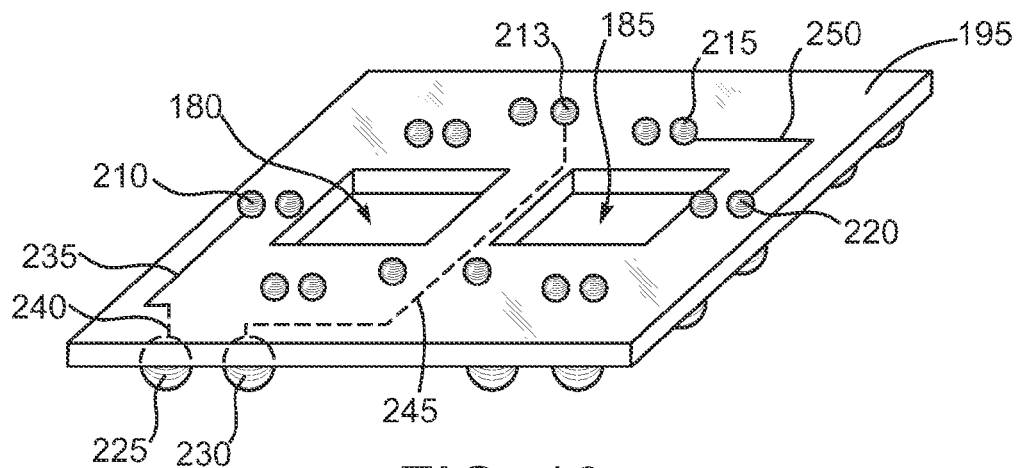
FIG. 10 is a pictorial view of the interposer depicted in FIG. 9.

The skilled artisan will appreciate that the provision of one or more apertures in a circuit board will present conductor routing challenges. For example, and as shown in FIG. 10, which is a pictorial view of the circuit board 195 depicted in FIG. 9, various electrical routing structures such as traces and conductive vias will have to be routed around the apertures 180 and 185. Note that a few of the interconnect structures that are designed to establish electrical interconnects between the interposer 20 depicted in FIG. 9 and the circuit board 195 depicted in FIG. 10 are shown and labeled 210, 215 and 220. In addition, a few of the interconnect structures that are designed to electrically connect the circuit board 195 to the circuit board 85 depicted in FIG. 9 are visible and labeled 225 and 230. Assume for the purposes of this illustration that the interconnect structure 210 is directly connected electrically to the interconnect structure 225 by way of the surface trace 235 and a conductive via 240 shown in phantom. Thus, the electrical pathway between the interconnect structure 210 and the interconnect structure 225 must route around the aperture 180 and also the aperture 185 as necessary. The same is true for the electrical pathway represented schematically by the dashed line 245 between the interconnect structure 213 and the interconnect structure 230. Again the same is true for the surface trace 250 which connects the interconnect structure 215 and the interconnect structure 220. Again, the point of the schematic depictions of the various electrical routing structures in FIG. 10 is to merely illustrate that the provision of the apertures 180 and 185 to accommodate the stacks 170 and 175 shown in FIG. 9 will require the routing of any internal or external electrical wiring structures around those apertures 180 and 185.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
coupling an interposer to a first substrate wherein a side of the interposer faces the first substrate, the first substrate including a first aperture extending through the first substrate;
coupling a first semiconductor chip to the side of the interposer; and
placing a thermal management device in thermal contact with the first semiconductor chip by way of the first aperture, the thermal management device not extending laterally beyond the first aperture.

2. The method of claim 1, wherein the thermal management device comprises one of a heat spreader, a vapor chamber or a thermoelectric cooler.

3. The method of claim 1, wherein at least one of the first semiconductor chip and the thermal management device is at least partially positioned in the first aperture.

4. The method of claim 1, comprising coupling plural semiconductor chips to the side of the interposer.

5. The method of claim 1, wherein the first substrate comprises a circuit board, the method comprising coupling the first circuit board to a second circuit board.

6. The method of claim 5, wherein the second circuit board comprises a second aperture and the thermal management device is at least partially positioned in the second aperture.

7. The method of claim 6, wherein the thermal management device is coupled to the second circuit board.

8. A method of manufacturing, comprising:
placing a thermal management device in thermal contact with a first semiconductor chip of a semiconductor chip device; and
wherein the semiconductor chip device includes a first substrate, an interposer coupled to the first substrate and having a side facing the first substrate, the first semiconductor chip being coupled to the side, the first substrate including a first aperture extending through the first substrate, and the thermal contact is by way of the first aperture and the thermal management device not extending laterally beyond the first aperture.

9. The method of claim 8, wherein the thermal management device comprises one of a heat spreader, a vapor chamber or a thermoelectric cooler.

10. The method of claim 8, wherein at least one of the first semiconductor chip and the thermal management device is at least partially positioned in the first aperture.

11. The method of claim 8, wherein the semiconductor chip device comprises plural semiconductor chips coupled to the side of the interposer.

12. The method of claim 8, wherein the first substrate comprises a circuit board, the method comprising coupling the first circuit board to a second circuit board.

13. The method of claim 12, wherein the second circuit board comprises a second aperture and the thermal management device is at least partially positioned in the second aperture.

14. The method of claim 13, wherein the thermal management device is coupled to the second circuit board.

15. A semiconductor chip device, comprising:
a first substrate including a first aperture extending therethrough;
an interposer coupled to the first substrate and having a side facing the first substrate;
a first semiconductor chip coupled to the side; and
a thermal management device in thermal contact with the first semiconductor chip by way of the first aperture, the thermal management device not extending laterally beyond the first aperture.

16. The semiconductor chip device of claim 15, wherein the thermal management device comprises one of a heat spreader, a vapor chamber or a thermoelectric cooler.

17. The semiconductor chip device of claim 15, wherein at least one of the first semiconductor chip and the thermal management device is at least partially positioned in the first aperture.

18. The semiconductor chip device of claim 15, wherein both the first semiconductor chip and the thermal management device are at least partially positioned in the first aperture.

19. The semiconductor chip device of claim 15, comprising plural semiconductor chips coupled to the side of the interposer.

20. The semiconductor chip device of claim 15, wherein the first substrate comprises a circuit board coupled to a second circuit board.

21. The semiconductor chip device of claim 20, wherein the second circuit board comprises a second aperture and the thermal management device is at least partially positioned in the second aperture.

22. The semiconductor chip device of claim 21, wherein the thermal management device is coupled to the second circuit board.

23. A semiconductor chip device, comprising:
- a first substrate including a first aperture and a second aperture, the first and second aperture each extending therethrough;
- an interposer coupled to the first substrate and having a side facing the first substrate;
- a first semiconductor chip and a second semiconductor chip coupled to the side; and
- a thermal management device in thermal contact with the first semiconductor chip by way of the first aperture and the second semiconductor chip by way of the second aperture.

24. A method of manufacturing, comprising:
- coupling an interposer to a first substrate wherein a side of the interposer faces the first substrate, the first substrate including a first aperture and a second aperture, the first aperture and the second aperture each extending through the first substrate;
- coupling a first semiconductor chip and a second semiconductor chip to the side of the interposer; and
- placing a thermal management device in thermal contact with the first semiconductor chip by way of the first aperture and the second semiconductor chip by way of the second aperture.

* * * * *